(12) United States Patent
Kawaguchi et al.

(10) Patent No.: US 12,712,108 B2
(45) Date of Patent: Aug. 18, 2026

(54) COIL COMPONENT AND MANUFACTURING METHOD THEREFOR

(71) Applicant: TDK Corporation, Tokyo (JP)

(72) Inventors: Yuuichi Kawaguchi, Tokyo (JP); Mitsuo Natori, Tokyo (JP); Azuma Satoh, Tokyo (JP)

(73) Assignee: TDK Corporation, Tokyo (JP)

( * ) Notice: Subject to any disclaimer, the term of this patent is extended or adjusted under 35 U.S.C. 154(b) by 801 days.

(21) Appl. No.: 18/157,955

(22) Filed: Jan. 23, 2023

(65) Prior Publication Data

US 2023/0238170 A1 Jul. 27, 2023

(30) Foreign Application Priority Data

Jan. 27, 2022 (JP) ................................ 2022-010726

(51) Int. Cl.

| | |
|---|---|
| ***H03H 7/01*** | (2006.01) |
| ***H01F 17/00*** | (2006.01) |
| ***H01F 17/04*** | (2006.01) |
| ***H01F 27/29*** | (2006.01) |
| ***H01F 41/04*** | (2006.01) |
| *H03H 1/00* | (2006.01) |

(52) U.S. Cl.

CPC ......... *H01F 17/0013* (2013.01); *H01F 17/04* (2013.01); *H01F 27/292* (2013.01); *H01F 41/041* (2013.01); *H03H 7/0115* (2013.01); *H01F 2017/0066* (2013.01); *H01F 2017/0073* (2013.01); *H01F 2017/048* (2013.01); *H03H 2001/0085* (2013.01)

(58) Field of Classification Search

CPC ......... H01F 17/0013; H01F 2017/0026; H01F 2017/0066; H03H 2001/0085; H03H 7/0115

USPC .................................. 333/175, 185; 336/200

See application file for complete search history.

(56) References Cited

U.S. PATENT DOCUMENTS

| | | | | |
|---|---|---|---|---|
| 2016/0372246 | A1* | 12/2016 | Otsubo ................. | H01F 27/245 |
| 2019/0088413 | A1 | 3/2019 | Kawaguchi et al. | |
| 2021/0098181 | A1 | 4/2021 | Araki et al. | |
| 2023/0126614 | A1* | 4/2023 | Suzuki ................. | H01F 41/122 336/192 |

FOREIGN PATENT DOCUMENTS

| | | | |
|---|---|---|---|
| CN | 106816262 | A | 6/2017 |
| JP | 2019-054144 | A | 4/2019 |
| JP | 2019-140202 | A | 8/2019 |

* cited by examiner

*Primary Examiner* — Rakesh B Patel
(74) *Attorney, Agent, or Firm* — RIMON P.C.

(57) ABSTRACT

Disclosed herein is a coil component that includes: a coil part having a structure in which alternately stacking a plurality of conductor layers each including a spiral coil pattern and a plurality of insulating layers; a first magnetic layer disposed in an inner diameter area of the coil part, in an outside area of the coil part, and on one side in an axial direction of the coil part; and a second magnetic layer disposed on other side in the axial direction of the coil part. Each of the first and second magnetic layers comprises a composite magnetic material containing magnetic fillers and binder resin. The content of the magnetic filers in the first magnetic layer is higher than the content of the magnetic fillers in the second magnetic layer.

8 Claims, 7 Drawing Sheets

10
L1
M12

M11
20
L2
M12

M11
21
30
L3
M12

M11
31
40
L4
M12

M11
41

COIL COMPONENT AND MANUFACTURING METHOD THEREFOR

BACKGROUND OF THE ART

Field of the Art

The present disclosure relates to a coil component and a manufacturing method therefor and, more particularly, to a coil component having a structure in which a coil part including a spiral coil pattern is embedded in a magnetic element body and a manufacturing method for such a coil component.

Description of Related Art

JP 2019-054144A discloses in FIG. 10 a coil component having a structure in which a coil part including a spiral coil pattern is embedded in a magnetic element body made of a composite magnetic material. In JP 2019-054144A, the average particle diameter of magnetic fillers at the front and back surface portions of the magnetic element body is made smaller than the average particle diameter of magnetic fillers at other portions so as to suppress a reduction in the volume of the magnetic element body due to coming off of the magnetic fillers.

However, an effect of preventing coming off of the magnetic fillers is insufficient only by reducing the average particle diameter of the magnetic fillers at the front and back surface portions of the magnetic element body. Further, it is difficult to sufficiently prevent corner chipping of the magnetic element body from occurring during manufacturing.

SUMMARY

It is therefore an object of the present disclosure to prevent, in a coil component having a structure in which a coil part including a spiral coil pattern is embedded in a magnetic element body and a manufacturing method for such a coil component, coming off of the magnetic fillers and the occurrence of corner chipping of the magnetic element body.

A coil component according to the present disclosure includes: a coil part obtained by alternately stacking a plurality of conductor layers each including a spiral coil pattern and a plurality of insulating layers; a first magnetic layer disposed in the inner diameter area of the coil part, in the outside area of the coil part, and on one side in the axial direction of the coil part; and a second magnetic layer disposed on the other side in the axial direction of the coil part. The first and second magnetic layers are each made of a composite magnetic material containing magnetic fillers and binder resin. The content of the magnetic filers in the first magnetic layer is higher than the content of the magnetic fillers in the second magnetic layer.

A coil component manufacturing method according to the present disclosure includes the steps of: forming a coil part on a support substrate by alternately stacking a plurality of conductor layers each including a spiral coil pattern and a plurality of insulating layers; forming a first magnetic layer in the inner diameter area of the coil part, in the outside area of the coil part, and on one side in the axial direction of the coil part; forming, after removal of the support substrate, a second magnetic layer on the other side in the axial direction of the coil part; and dicing the first and second magnetic layers from the one side in the axial direction for singulation. The first and second magnetic layers are each made of a composite magnetic material containing magnetic fillers and binder resin. The content of the magnetic filers in the first magnetic layer is higher than the content of the magnetic fillers in the second magnetic layer.

BRIEF DESCRIPTION OF THE DRAWINGS

The above and other objects, features and advantages of this disclosure will become more apparent by reference to the following detailed description of the disclosure taken in conjunction with the accompanying drawings, wherein.

DETAILED DESCRIPTION OF THE EMBODIMENTS

Preferred embodiments of the present disclosure will now be explained in detail with reference to the drawings.

Figure 1:
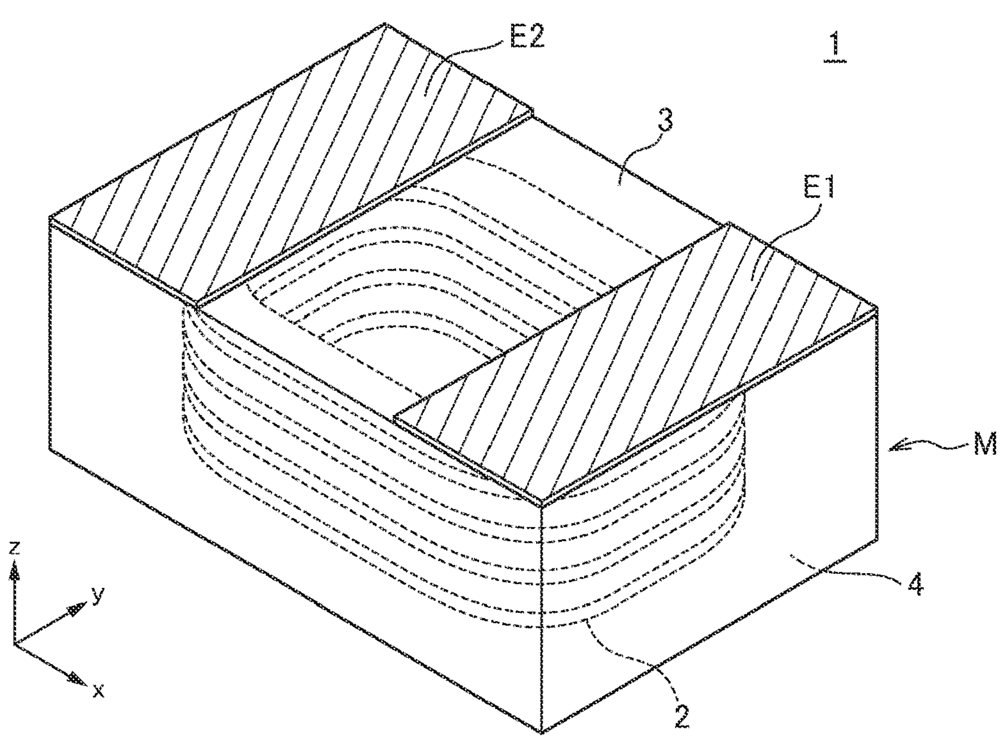
FIG. 1 is a schematic perspective view for explaining the outer appearance of a coil component 1 according to an embodiment of the present disclosure.

FIG. 1 is a schematic perspective view for explaining the outer appearance of a coil component 1 according to an embodiment of the present disclosure.

As illustrated in FIG. 1, the coil component 1 according to the present embodiment has a structure in which a coil part 2 having a coil axis extending in the z-direction is embedded in a magnetic element body M. The magnetic element body M has surfaces 3 and 4 being perpendicular to the coil axis and constituting the xy surface. The surface 3 has terminal electrodes E1 and E2. At mounting of the coil component 1, the terminal electrodes E1 and E2 are soldered to a circuit board such that the surface 3 faces the circuit board.

Figure 2:
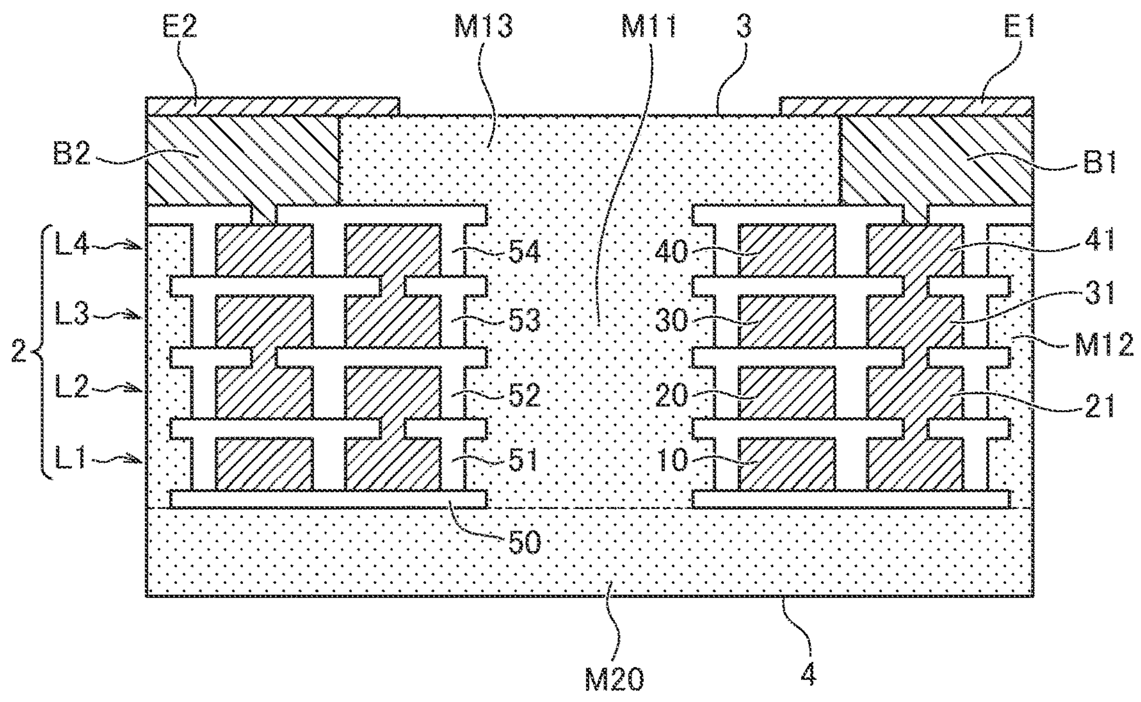
FIG. 2 is a schematic cross-sectional view of the coil component 1.
Figures 3A, 3B, 3C, 3D:
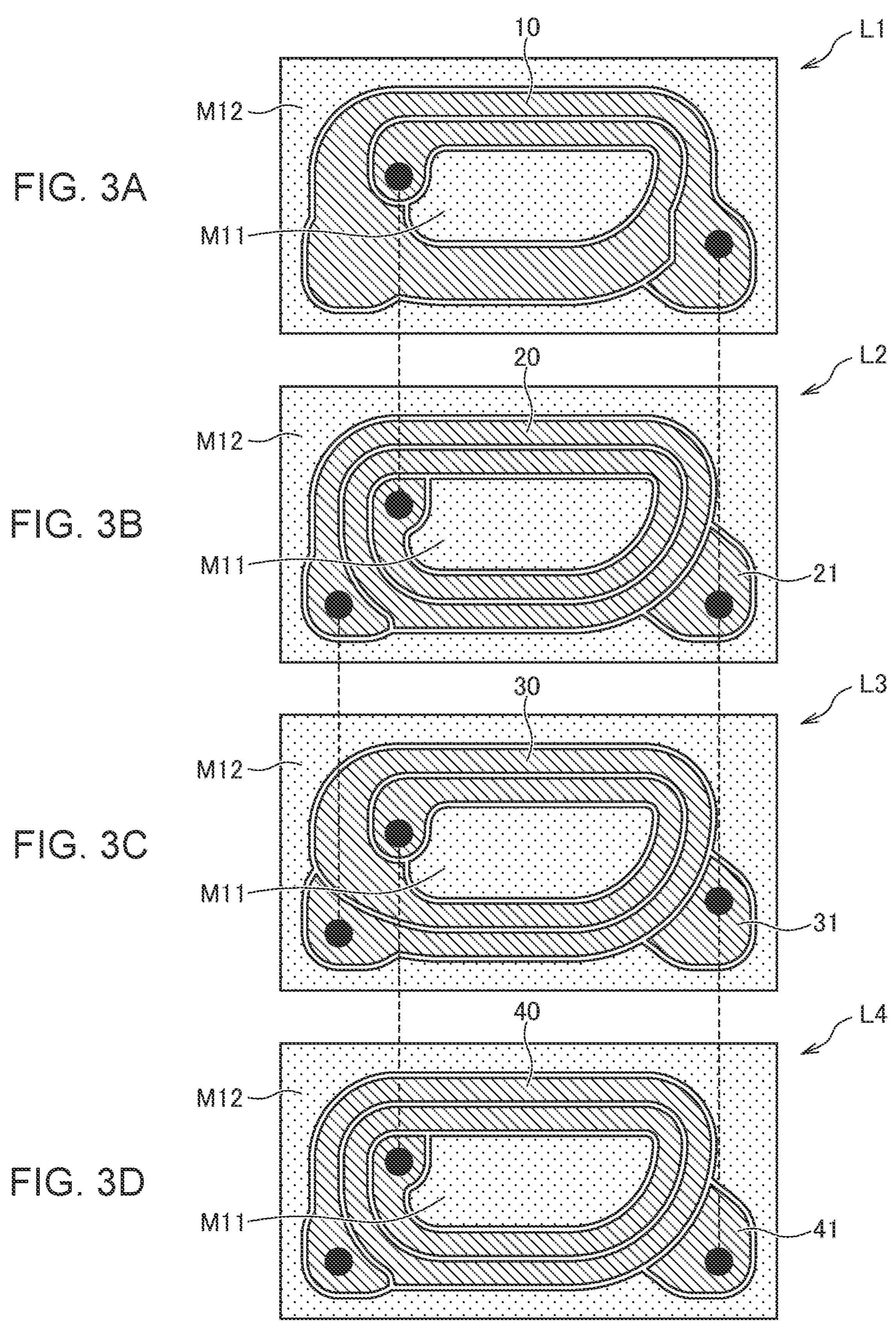
FIGS. 3A to 3D are schematic plan views for explaining the pattern shapes of the conductor layers L1 to L4, respectively.

FIG. 2 is a schematic cross-sectional view of the coil component 1 according to the present embodiment.

As illustrated in FIG. 2, the coil part 2 of the coil component 1 according to the present embodiment includes interlayer insulating films 50 to 54 and conductor layers L1 to L4 which are alternately stacked in the coil axis direction (z-direction). The magnetic element body M includes magnetic layers M11 to M13 and M20. The magnetic layer M11 is provided in the inner diameter area of the coil part 2, the magnetic layer M12 is provided at an outside area in the radial direction of the coil part 2, the magnetic layer M13 covers the coil part 2 from one side in the coil axis direction, and the magnetic layer M20 covers the coil part 2 from the other side in the coil axis direction. The magnetic layer M20 contacts the magnetic layer M11 at a portion overlapping the inner diameter area of the coil part 2 and contacts the magnetic layer M12 at a portion overlapping the outside area of the coil part 2. The magnetic layers M11 to M13 are formed integrally. The contact area between the magnetic layers M20 and M12 is preferably substantially the same as or larger than the contact area between the magnetic layers M20 and M11. This makes chipping, which is likely to occur at the corner portions of the magnetic element body M, less likely to occur in a manufacturing process to be described later.

The magnetic layer M13 embeds therein bump electrodes B1 and B2. The bump electrodes B1 and B2 are exposed at least from the surface 3, and the terminal electrodes E1 and E2 are formed on the surface 3 of the magnetic element body M so as to contact the bump electrodes B1 and B2 exposed from the surface 3. The bump electrodes B1 and B2 are each a pillar-shaped conductor made of, e.g., Cu and plays a role of connecting both ends of the coil part 2 to the terminal electrodes E1 and E2, respectively.

The conductor layers L1 to L4 have spiral patterns 10, 20, 30, and 40, respectively. The magnetic layers M11 to M13 and M20 constituting the magnetic element body M are each made of a composite magnetic material containing magnetic fillers and a binder resin. As the magnetic fillers, a magnetic metal material such as iron (Fe) or a permalloy-based material is preferably used. The binder resin may preferably be an epoxy resin. The magnetic element body M forms a magnetic path for magnetic flux generated by making current flow in the coil patterns 10, 20, 30, and 40.

The magnetic layers M11 to M13 are made of the same composite magnetic material, while the magnetic layer M20 is made of a composite magnetic material different from those of the magnetic layers M11 to M13. In the present embodiment, the content of the magnetic fillers in the magnetic layers M11 to M13 is higher than the content of the magnetic fillers in the magnetic layer M20. In other words, the content of the binder resin in the magnetic layer M20 is higher than the content of the binder resin in the magnetic layers M11 to M13. For example, the content of the magnetic fillers and the content of the binder resin in the magnetic layers M11 to M13 are 97.8 wt % and 2.2 wt %, respectively, while the content of the magnetic fillers and the content of the binder resin in the magnetic layer M20 are 97.4 wt % and 2.6 wt %, respectively.

As a result, the magnetic layers M11 to M13 can achieve higher permeability, while the magnetic layer M20 can achieve higher mechanical strength. For example, when the content of the magnetic fillers and the content of the binder resin in the magnetic layers M11 to M13 are 97.8 wt % and 2.2 wt %, respectively, the permeability thereof is about 62, and the bending strength thereof is 73 MPa, while when the content of the magnetic fillers and the content of the binder resin in the magnetic layer M20 are 97.4 wt % and 2.6 wt %, respectively, the permeability thereof is about 55, and the bending strength thereof is 96 MPa.

In the present embodiment, the permeability of the magnetic layers M11 to M13 constituting most part of the magnetic element body M is high, so that high inductance can be achieved. In particular, the inner diameter area of the coil part 2 has the highest magnetic flux density, so that it is possible to further increase inductance by embedding the magnetic layer M11 in this area. Further, the magnetic layer M13 embeds therein the bump electrodes B1 and B2 and correspondingly decreases in volume, resulting in a reduction in inductance; however, by using a material having a high permeability as the material of the magnetic layer M13, high inductance can be achieved. On the other hand, for the magnetic layer M20, the content of the magnetic fillers is reduced, and correspondingly, the content of the binder resin is increased, so that it is possible to prevent chipping which is likely to occur at the corner portions of the magnetic element body M during a manufacturing process to be described later and further to prevent coming off of the magnetic fillers.

The material and average particle diameter of the magnetic fillers contained in the magnetic layers M11 to M13 may be the same as or different from those of the magnetic fillers contained in the magnetic layer M20. However, when the material and average particle diameter of the magnetic fillers contained in the magnetic layers M11 to M13 are the same as those of the magnetic fillers contained in the magnetic layer M20, it is possible not only to reduce material cost but also to facilitate adjustment of the permeability and mechanical strength based on the content of the magnetic fillers.

The material of the binder resin contained in the magnetic layers M11 to M13 may be the same as or different from that of the binder resin contained in the magnetic layer M20. However, when the material of the binder resin contained in the magnetic layers M11 to M13 is the same as that of the binder resin contained in the magnetic layer M20, it is possible not only to reduce material cost but also to increase adhesion between the magnetic layers M11, M12 and the magnetic layer M20.

FIGS. 3A to 3D are schematic plan views for explaining the pattern shapes of the conductor layers L1 to L4, respectively.

As illustrated in FIGS. 3A to 3D, the conductor layer L1 has a coil pattern 10, the conductor layer L2 has a coil pattern 20 and a connection pattern 21, the conductor layer L3 has a coil pattern 30 and a connection pattern 31, and the conductor pattern L4 has a coil pattern 40 and a connection pattern 41. The connection patterns 21, 31, and 41 are mutually short-circuited to connect the outer peripheral end of the coil pattern 10 and the bump electrode B1. The inner peripheral end of the coil pattern 10 is connected to the inner peripheral end of the coil pattern 20, the outer peripheral end of the coil pattern 20 is connected to the outer peripheral end of the coil pattern 30, the inner peripheral end of the coil pattern 30 is connected to the inner peripheral end of the coil pattern 40, and the outer peripheral end of the coil pattern 40 is connected to the bump electrode B2. As a result, the coil patterns 10, 20, 30, and 40 are connected in series between the terminal electrodes E1 and E2.

The following describes a manufacturing method for the coil component 1 according to the present embodiment.

FIGS. 4 to 9 are process views for explaining the manufacturing method for the coil component 1 according to the present embodiment. Although the process views illustrated in FIGS. 4 to 8 each illustrate a portion corresponding to one coil component 1, a plurality of coil components 1 are actually produced at a time using an aggregate substrate.

Figure 4:
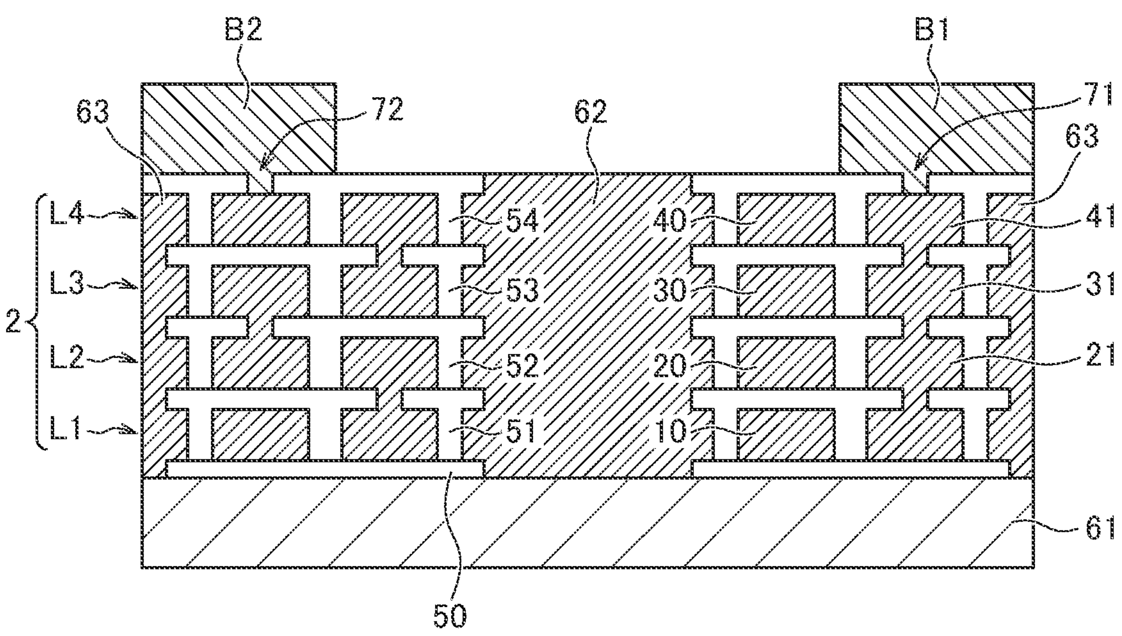
FIGS. 4 to 9 are process views for explaining the manufacturing method for the coil component 1.

As illustrated in FIG. 4, the interlayer insulating films 50 to 54 and conductor layers L1 to L4 are alternately formed on the surface of a support substrate 61 to form the coil part 2, and then vias 71 and 72 are formed in the interlayer insulating film 54. The conductor layers L1 to L4 can be formed by electrolytic plating. The via 71 is formed at a position where the connection pattern 41 is exposed, and the via 72 is formed at a position where the outer peripheral end of the coil pattern 40 is exposed. The conductor layers L1 to L4 each include a sacrificial pattern 62 positioned in the inner diameter area of the coil part 2 and a sacrificial pattern 63 positioned at the outside area of the coil part 2. Subsequently, electrolytic plating is performed to form the bump electrodes B1 and B2 on the surface of the interlayer insulating film 54. As a result, the bump electrode B1 is connected to the connection pattern 41 through the via 71, and the bump electrode B2 is connected to the outer peripheral end of the coil pattern 40 through the via 72.

Figure 5:
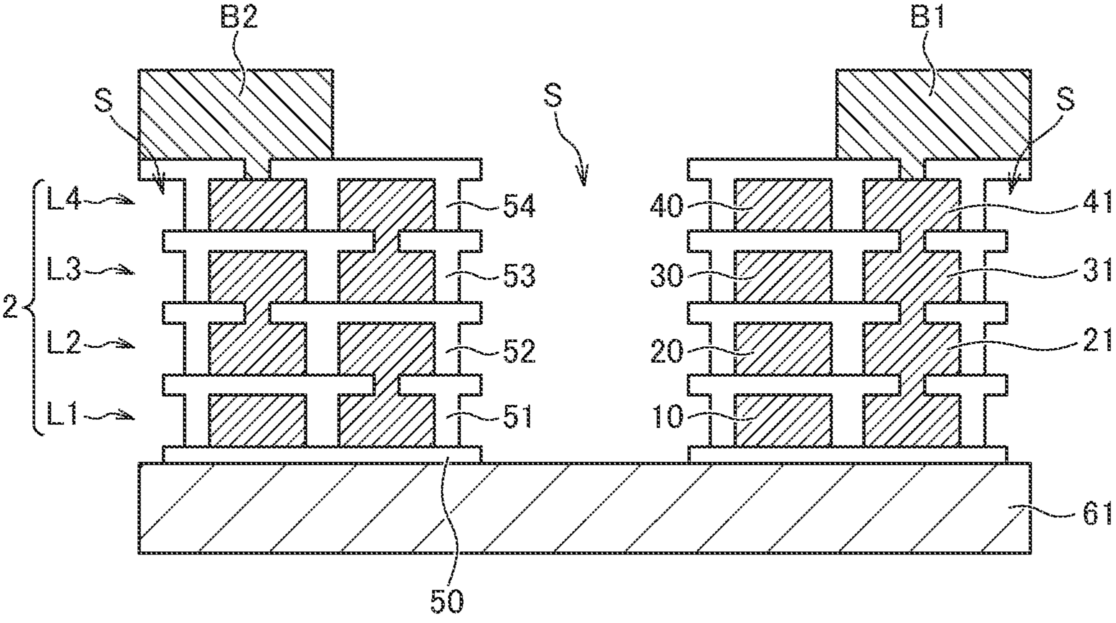
Figure 6:
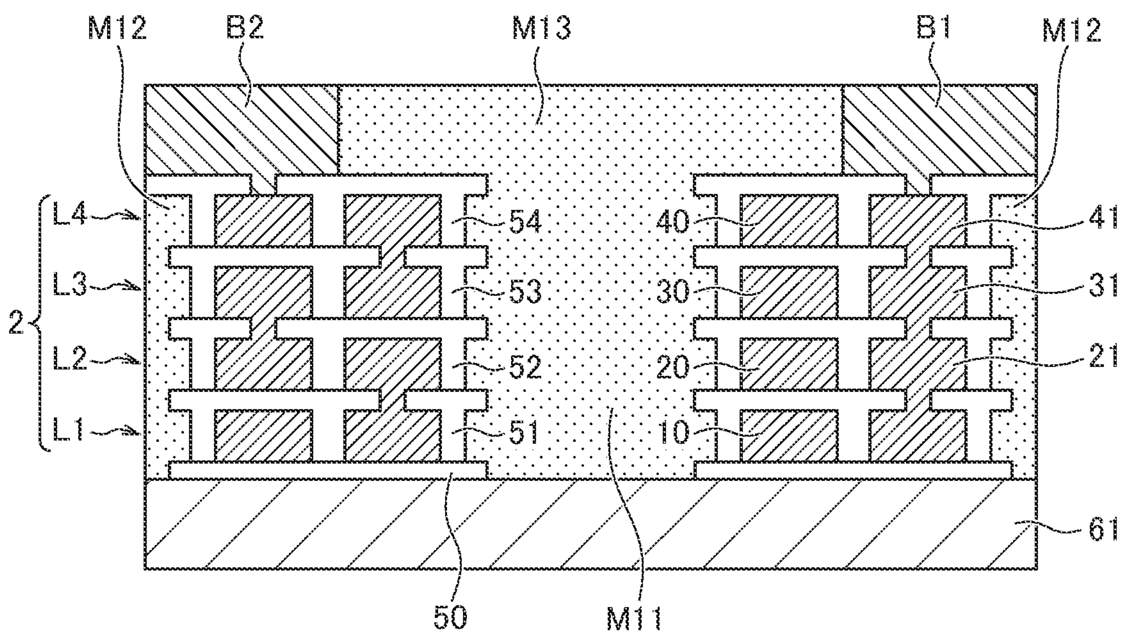
Figure 7:
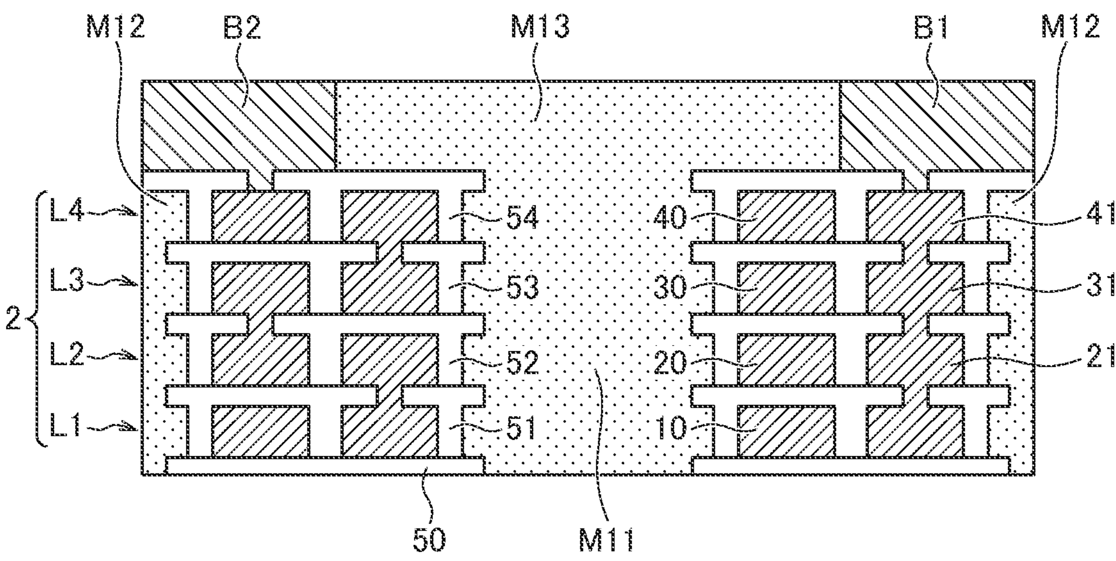
Figure 8:
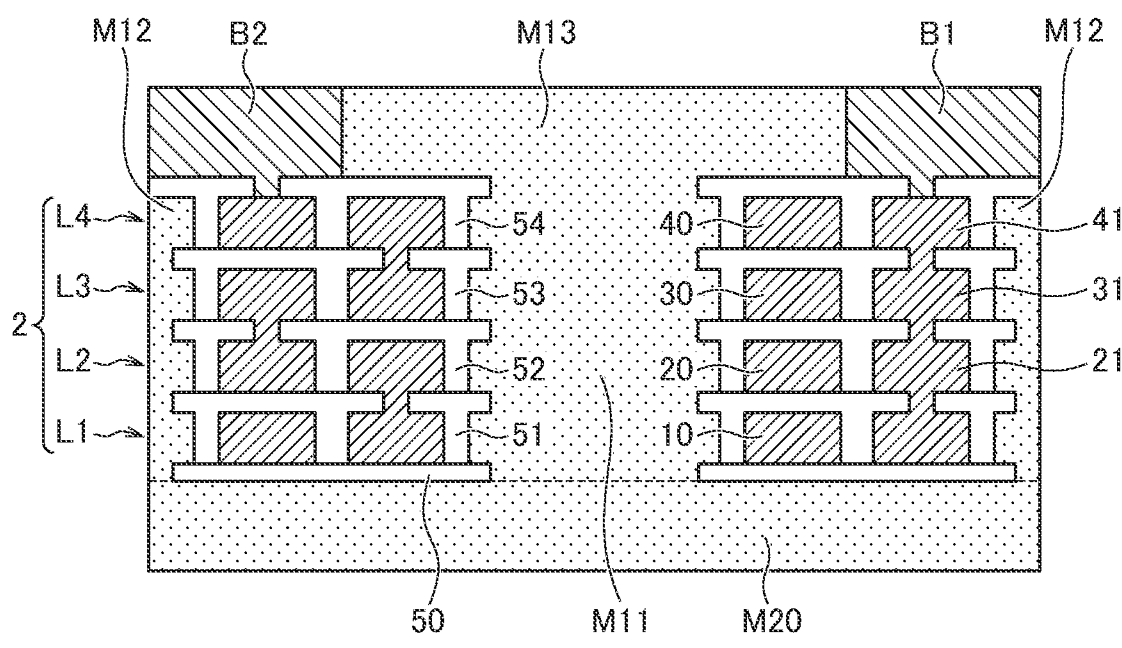

Then, as illustrated in FIG. 5, wet etching is performed to remove the sacrificial patterns 62 and 63. The conductor patterns constituting the coil part 2 are covered with the interlayer insulating films 50 to 54 and are thus not etched. The bump electrodes B1 and B2 each need to be covered with a resist pattern so as not to be etched. As a result, a space S is formed in the inner diameter area and outside area of the coil part 2. Then, as illustrated in FIG. 6, the space S formed by removal of the sacrificial patterns 62 and 63 is filled with the magnetic layers M11 to M13. Then, the support substrate 61 is removed as illustrated in FIG. 7, and the magnetic layer M20 covering the interlayer insulating film 50 is formed as illustrated in FIG. 8. When the lower surface of the interlayer insulating film 50 is roughened before the formation of the magnetic layer M20, adhesion between the magnetic layer M20 and the interlayer insulating film 50 can be increased. That is, the magnetic layers M11 to M13 are formed for embedding therein the coil part 2 having an irregular shape, so that even if the surface roughness of the upper surface of, e.g., the interlayer insulating film 54 is small, sufficient adhesion between the magnetic layers M11 to M13 and the interlayer insulating film 54 can be achieved. On the other hand, the magnetic layer M20 is formed on the flat surface of the coil part 2, so that the surface roughness of the lower surface of the interlayer insulating film 50 is made larger than the surface roughness of the upper surface of the interlayer insulating film 54 so as to ensure adhesion with the magnetic layer M20.

Figure 9:
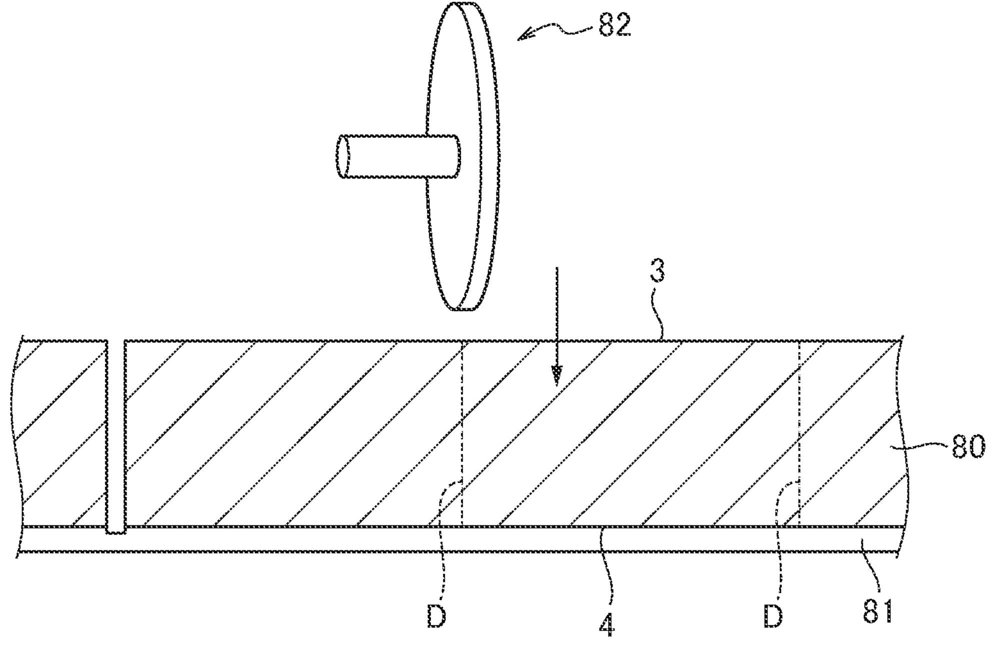

Then, as illustrated in FIG. 9, an aggregate substrate 80 including a plurality of coil components 1 is attached to a dicing tape 81 and cut using a blade 82 along a dicing line D, whereby the coil components 1 are singulated. The cutting using the blade 82 is performed from the surface 3 side of the magnetic element body M. The surface 4 of the magnetic element body M positioned on the side opposite to the surface 3 is attached to the dicing tape 81, that is, the surface 3 is on the cutting start side, and the surface 4 is the cutting (dicing) termination side. In this case, as the cutting using the blade 82 advances, the residual thickness of the aggregate substrate 80 decreases, so that stress concentrates on the lower portion of the dicing line D, which may generate chipping at the surface 4 at a timing when the blade 82 reaches the vicinity of the surface 4. However, in the coil component 1 according to the present embodiment, the mechanical strength of the magnetic layer M20 constituting the surface 4 is high, so that it is possible to prevent corner chipping of the magnetic element body M which is likely to occur at the termination of the dicing.

Corner chipping is likely to occur also when the singulated coil components 1 are peeled off from the dicing tape 81 after completion of the dicing. However, in the present embodiment, the mechanical strength of the magnetic layer M20 is high, so that it is possible to prevent corner chipping of the magnetic element body M which is likely to occur at peeling off of the dicing tape 81.

As described above, in the present embodiment, mechanical strength is enhanced by increasing the content of the binder resin in the magnetic layer M20 positioned at the dicing termination side, thereby making it possible to prevent corner chipping of the magnetic element body M which is likely to occur at the termination of the dicing. Further, the aggregate substrate 80 having a large size is likely to warp during manufacture; however, when the same material is used for the binder resin contained in the magnetic layers M11 to M13 and the binder resin contained in the magnetic layer M20, warpage of the aggregate substrate 80 due to a difference in thermal expansion coefficient is less likely to occur.

The coil component 1 thus obtained is picked up by a chip mounter and mounted on a circuit board. In this case, the surface 4 of the magnetic layer M20 positioned on the side opposite to the surface 3 on which the bump electrodes B1 and B2 are provided serves as an adsorption surface and may thus be ground so as to be smaller in surface roughness than the surface 3.

Figure 10:
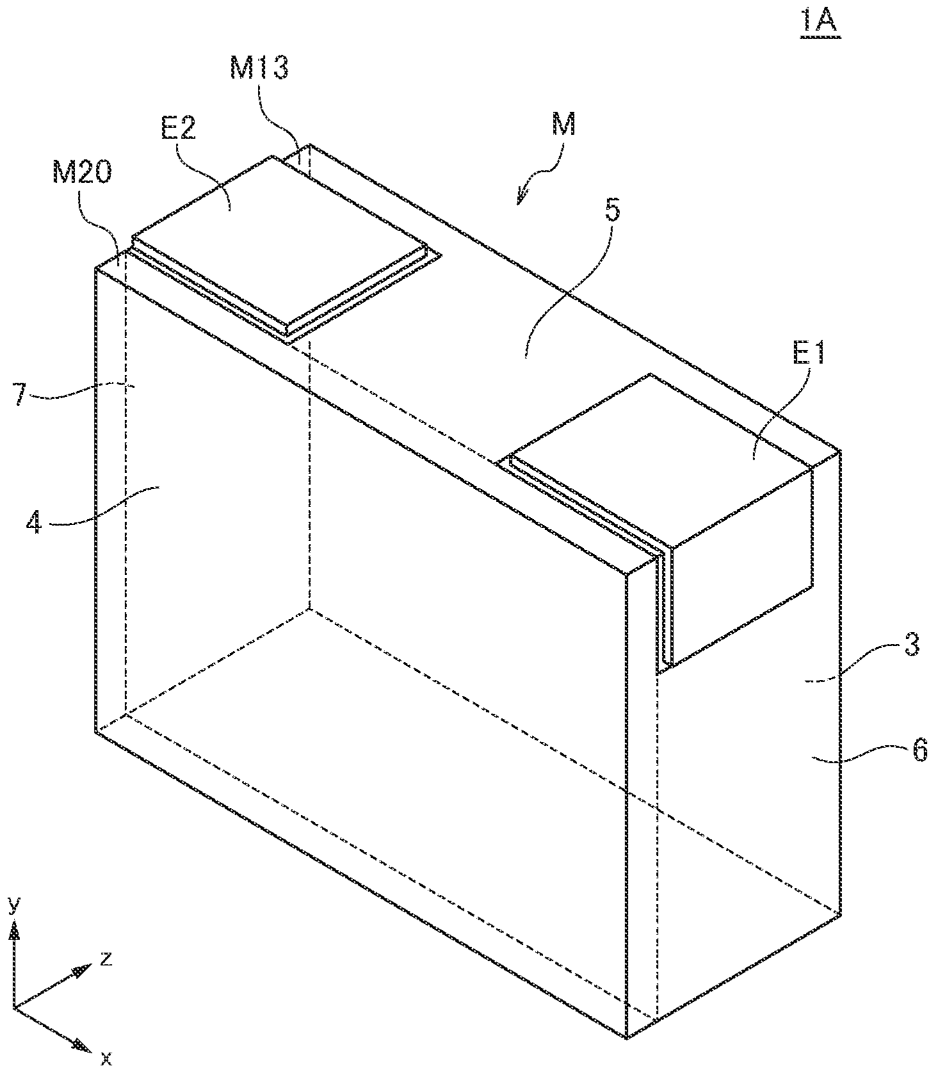
FIG. 10 is a schematic perspective view for explaining the outer appearance of a coil component 1A according to a modification.
Figure 11:
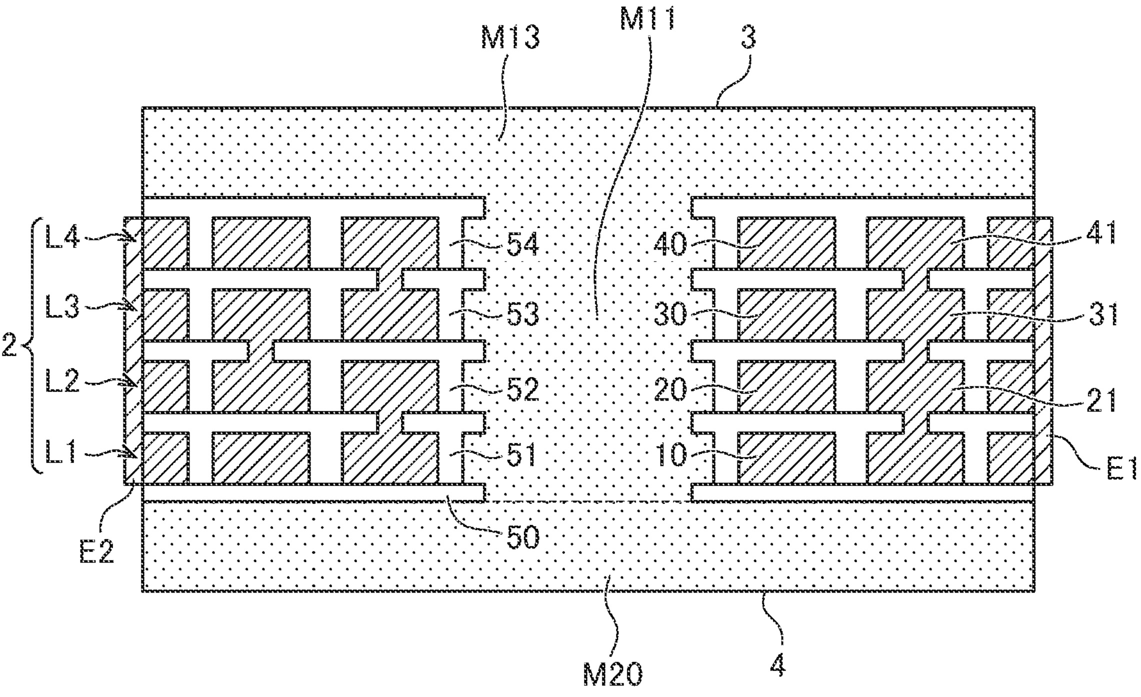
FIG. 11 is a schematic cross-sectional view of the coil component 1A.

FIG. 10 is a schematic perspective view for explaining the outer appearance of a coil component 1A according to a modification. FIG. 11 is a schematic cross-sectional view of the coil component 1A.

The coil component 1A illustrated in FIGS. 10 and 11 differs from the coil component 1 according to the above embodiment in that, in place of providing the bump electrodes B1 and B2, the conductor layers L1 to L4 are partly exposed from a side surface 5 constituting the xz surface of the magnetic element body M and side surfaces 6 and 7 constituting the yz surface thereof to form the terminal electrodes E1 and E2 on the side surfaces 5 to 7. Other basic configurations are the same as those of the coil component 1, so the same reference numerals are given to the same elements, and overlapping description will be omitted.

As exemplified by the coil component 1A according to the modification, it is not essential to use the bump electrode in the present disclosure, and the terminal electrodes E1 and E2 may be provided on the side surfaces 5 to 7 of the magnetic element body M.

While the preferred embodiment of the present disclosure has been described, the present disclosure is not limited to the above embodiment, and various modifications may be made within the scope of the present disclosure, and all such modifications are included in the present disclosure.

The technology according to the present disclosure includes the following configuration examples but not limited thereto.

A coil component according to the present disclosure includes: a coil part obtained by alternately stacking a plurality of conductor layers each including a spiral coil pattern and a plurality of insulating layers; a first magnetic layer disposed in the inner diameter area of the coil part, in the outside area of the coil part, and on one side in the axial direction of the coil part; and a second magnetic layer disposed on the other side in the axial direction of the coil part. The first and second magnetic layers are each made of a composite magnetic material containing magnetic fillers and binder resin. The content of the magnetic filers in the first magnetic layer is higher than the content of the magnetic fillers in the second magnetic layer.

According to the present disclosure, the mechanical strength of the second magnetic layer is enhanced, thus making it possible to prevent coming off of the magnetic fillers and chipping from occurring on the second magnetic layer side. On the other hand, the first magnetic layer has higher magnetic characteristics, making it possible to increase inductance of the coil part.

In the present disclosure, the material and average particle diameter of the magnetic fillers contained in the first magnetic layer may be the same as those of the magnetic fillers contained in the second magnetic layer. This configuration makes it possible to reduce material cost.

In the present disclosure, the first and second magnetic layers may contact each other, and the material of the binder resin contained in the first magnetic layer may be the same as the material of the binder resin contained in the second magnetic layer. This makes it possible to increase adhesion between the first and second magnetic layers.

The coil component according to the present disclosure may further include a bump electrode connected to the coil part, and the bump electrode may be embedded in the first magnetic layer and exposed from the surface of the first magnetic layer on the side perpendicular to the axial direction. Providing the bump electrode reduces the volume of a magnetic element body constituted of the first and second magnetic layers; however, the content of the magnetic fillers in the first magnetic layer is high, so that it is possible to suppress a reduction in inductance.

In the present disclosure, the surface of the second magnetic layer on the side perpendicular to the axial direction may be smaller in surface roughness than the surface of the first magnetic layer. This facilitates pickup of the surface of the second magnetic layer when the coil component is mounted on a circuit board.

A coil component manufacturing method according to the present disclosure includes the steps of: forming a coil part on a support substrate by alternately stacking a plurality of conductor layers each including a spiral coil pattern and a plurality of insulating layers; forming a first magnetic layer in the inner diameter area of the coil part, in the outside area of the coil part, and on one side in the axial direction of the coil part; forming, after removal of the support substrate, a second magnetic layer on the other side in the axial direction of the coil part; and dicing the first and second magnetic layers from the one side in the axial direction for singulation. The first and second magnetic layers are each made of a composite magnetic material containing magnetic fillers and binder resin. The content of the magnetic filers in the first magnetic layer is higher than the content of the magnetic fillers in the second magnetic layer.

According to the present disclosure, it is possible to prevent corner chipping of a magnetic element body constituted of the first and second magnetic layers which is likely to occur at the dicing termination side.

As described above, according to the present disclosure, in a coil component having a structure in which a coil part including a spiral coil pattern is embedded in a magnetic element body and a manufacturing method for such a coil component, it is possible to prevent coming off of magnetic fillers and the occurrence of corner chipping of the magnetic element body.

What is claimed is:

1. A coil component comprising:

a coil part having a structure in which alternately stacking a plurality of conductor layers each including a spiral coil pattern and a plurality of insulating layers;

a first magnetic layer disposed in an inner diameter area of the coil part, in an outside area of the coil part, and on one side in an axial direction of the coil part;

a second magnetic layer disposed on another side in the axial direction of the coil part; and a bump electrode connected to the coil part, wherein each of the first and second magnetic layers comprises a composite magnetic material containing magnetic fillers and binder resin, wherein a content of the magnetic fillers in the first magnetic layer is higher than a content of the magnetic fillers in the second magnetic layer, wherein the bump electrode is embedded in the first magnetic layer and exposed from a first surface of the first magnetic layer on a side perpendicular to the axial direction, and wherein a second surface of the second magnetic layer on a side perpendicular to the axial direction is smaller in surface roughness than the first surface of the first magnetic layer.

2. A coil component comprising:

a coil part having a structure in which alternately stacking a plurality of conductor layers each including a spiral coil pattern and a plurality of insulating layers;

a first magnetic layer disposed in an inner diameter area of the coil part, in an outside area of the coil part, and on one side in an axial direction of the coil part; and a second magnetic layer disposed on another side in the axial direction of the coil part, wherein each of the first and second magnetic layers comprises a composite magnetic material containing magnetic fillers and binder resin, wherein a content of the magnetic fillers in the first magnetic layer is higher than a content of the magnetic fillers in the second magnetic layer, and wherein a material and an average particle diameter of the magnetic fillers contained in the first magnetic layer is substantially a same as a material and an average particle diameter of the magnetic fillers contained in the second magnetic layer.

3. The coil component as claimed in claim 2, wherein the first and second magnetic layers are in contact with each other, and wherein a material of the binder resin contained in the first magnetic layer is substantially the same as a material of the binder resin contained in the second magnetic layer.

4. The coil component as claimed in claim 2, further comprising a bump electrode connected to the coil part, wherein the bump electrode is embedded in the first magnetic layer and exposed from a first surface of the first magnetic layer on a side perpendicular to the axial direction.

5. The coil component as claimed in claim 4, wherein a second surface of the second magnetic layer on a side perpendicular to the axial direction is smaller in surface roughness than the first surface of the first magnetic layer.

6. A coil component comprising:

a coil part having a structure in which alternately stacking a plurality of conductor layers each including a spiral coil pattern and a plurality of insulating layers;

a first magnetic layer disposed in an inner diameter area of the coil part, in an outside area of the coil part, and on one side in an axial direction of the coil part; and a second magnetic layer disposed on another side in the axial direction of the coil part, wherein each of the first and second magnetic layers comprises a composite magnetic material containing magnetic fillers and binder resin, wherein a content of the magnetic fillers in the first magnetic layer is higher than a content of the magnetic fillers in the second magnetic layer, wherein the plurality of insulating layers include a first insulating layer located closest to the another side in the axial direction of the coil part, wherein a lower surface of the first insulating layer is in contact with the second magnetic layer, and wherein the lower surface of the first insulating layer is roughened.

7. The coil component as claimed in claim 6, wherein a first contact area between the first magnetic layer disposed in the outside area of the coil part and the second magnetic layer is substantially the same as a second contact area between the first magnetic layer disposed in the inner diameter area of the coil part and the second magnetic layer.

8. The coil component as claimed in claim 6, wherein a first contact area between the first magnetic layer disposed in the outside area of the coil part and the second magnetic layer is larger than a second contact area between the first magnetic layer disposed in the inner diameter area of the coil part and the second magnetic layer.

* * * * *